(12) United States Patent
Schroegendorfer

(10) Patent No.: US 10,707,814 B2
(45) Date of Patent: Jul. 7, 2020

(54) AMPLIFIER DEVICE

(71) Applicant: INFINEON TECHNOLOGIES AG, Neubiberg (DE)

(72) Inventor: Daniel Schroegendorfer, Linz (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/122,433

(22) Filed: Sep. 5, 2018

(65) Prior Publication Data

US 2020/0076372 A1 Mar. 5, 2020

(51) Int. Cl.
*H03F 1/02* (2006.01)
*H03F 1/56* (2006.01)
*H04B 1/18* (2006.01)
*H03F 1/22* (2006.01)
*H03H 7/38* (2006.01)

(52) U.S. Cl.
CPC ............ *H03F 1/0216* (2013.01); *H03F 1/223* (2013.01); *H03F 1/565* (2013.01); *H04B 1/18* (2013.01); *H03F 2200/294* (2013.01); *H03H 7/38* (2013.01)

(58) Field of Classification Search
CPC .................................................... H03F 1/0216
USPC ........................................................ 330/136
See application file for complete search history.

(56) References Cited

U.S. PATENT DOCUMENTS

| | | | | |
|---|---|---|---|---|
| 3,350,648 A | * | 10/1967 | Beres | H03D 7/12 455/197.1 |
| 3,778,720 A | * | 12/1973 | Yello | H03F 3/19 455/341 |
| 2009/0219094 A1 | * | 9/2009 | Kim | H03D 7/1441 330/253 |
| 2012/0032742 A1 | * | 2/2012 | Hsieh | H03F 1/223 330/285 |
| 2016/0241295 A1 | * | 8/2016 | Lyalin | H03F 1/0288 |
| 2017/0288623 A1 | * | 10/2017 | Fujita | H03F 3/193 |

FOREIGN PATENT DOCUMENTS

| | | |
|---|---|---|
| EP | 3258597 A1 | 12/2017 |
| KR | 20110051124 A | 5/2011 |

OTHER PUBLICATIONS

Example Amplifier Circuit #1, Source Unknown, Date of Publication Unknown.
Example Amplifier Circuit #2, Source Unknown, Date of Publication Unknown.
Ding ,E Tal. "A novel low power UWB cascode SiGe BiCMOS LNA with current use and zero-pole cancellation", International Journal of Electronics and Communications, Nov. 12, 2017, pp. 323-328.
European earch Report, EP 19 19 30 16.3, dated Jan. 9, 2020, pp. 8.

\* cited by examiner

*Primary Examiner* — Patricia T Nguyen
(74) *Attorney, Agent, or Firm* — Armis IP Law, LLC

(57) ABSTRACT

A multi-stage device includes multiple stages such as a first stage and a second stage. During operation, the first stage receives an input signal and outputs an intermediate signal based on the input signal. The second stage is coupled to the first stage to receive the intermediate signal and produce an output signal. According to one configuration, the second stage includes: i) a transistor, and ii) a circuit path between the first stage and the transistor. The transistor component is controlled to derive the output signal from the intermediate signal inputted to the circuit path.

34 Claims, 15 Drawing Sheets

Mathematical derivation of $R_{out}$:

$$R_{out} = \frac{v_{out}}{i_{out}} = \frac{1 + \frac{C_{GS}}{C} + \left(gm + sC_{GS} - \frac{gm + sC_{GS}}{rds\left(\frac{1}{rds} + \frac{1}{sL_2}\right)}\right)sL_2 + \left(1 + \frac{C_{GS}}{C} + \left(gm + sC_{GS} - \frac{gm + sC_{GS}}{rds\left(\frac{1}{rds} + \frac{1}{sL_2}\right)}\right)sL_2\right)\frac{1}{sL_1} + sC_{GS}Z}{\left[\left(1 + \frac{C_{GS}}{C} + \left(gm + sC_{GS} - \frac{gm + sC_{GS}}{rds\left(\frac{1}{rds} + \frac{1}{sL_2}\right)}\right)sL_2\right)\frac{1}{sL_1} + gm + sC_{GS} - \frac{gm + sC_{GS}}{rds\left(\frac{1}{rds} + \frac{1}{sL_2}\right)}\right] - \frac{\frac{sL_2Z}{rds}}{1 - \left(1 + \frac{sL_2}{rds}\right)rds} - \frac{sL_2}{\left(1 + \frac{sL_2}{rds}\right)sL_1 rds}} \div v_{out} \cdot \frac{1}{\left(1 + \frac{sL_2}{rds}\right)}\left(1 + \frac{L_2}{L_1}\right)$$

$rds \to \infty$:

$$R_{out} = \frac{v_{out}}{i_{out}} = \frac{1 + \frac{C_{GS}}{C} + (gm + sC_{GS})sL_2 + \left[\left(1 + \frac{C_{GS}}{C} + (gm + sC_{GS})sL_2\right)\frac{1}{sL_1} + sC_{GS}\right]Z}{\left(1 + \frac{C_{GS}}{C} + (gm + sC_{GS})sL_2\right)\frac{1}{sL_1} + gm + sC_{GS}}$$

FIG. 6C

AMPLIFIER DEVICE

BACKGROUND

A conventional Low-Noise Amplifier (LNA) is an electronic amplifier that amplifies a very low-voltage input signal into an output signal without significantly degrading its signal-to-noise ratio. As a specific example, depending on a respective gain setting, an amplifier circuit produces a higher magnitude replica of the input signal, preferably with limited noise amplification.

Conventional LNA circuitry used in mobile communication devices typically support a so-called "linearity on demand" feature, which requires the implementation of different gain step modes. One of these modes is the so-called "High Gain Mode", which uses the maximum allowed current to achieve best gain and noise figure performance from the input to the output. Proper operation and performance of a communication device typically depends on the ability of the amplifier circuit to provide appropriate gain.

FIG. 1 is an example diagram illustrating a conventional amplifier circuit operating based on a power supply (such as a $V_{DD}$) of 1.8 volts DC. In general, during operation, the input stage 110 of the amplifier 100 produces the signal 120. Output stage 130 receives the signal 120 from the input stage 110 as input and produces the output signal Vout. The output voltage, Vout, is an amplified rendition of the input voltage Vin.

BRIEF DESCRIPTION

One drawback of the conventional amplifier in FIG. 1 is the voltage divider, namely, the combination of capacitor C1 and capacitor C2 in the output stage 130. For example, in general, the output voltage Vout=Vtank*[C1/(C1+C2)]; where Vtank=the voltage at node 118. High gain performance (~18 dB) of the amplifier 100 (such as a single cascode) is mainly caused by the capacitive voltage divider C1 and C2 in the output stage 130 (tank circuit) to achieve a good output matching (transformation from 200 Ohm to 50 Ohm). This transformation has a big drawback because it is possible to lose 25-50% of the voltage gain. Additionally, the output stage 130 of the amplifier 100 is tuned by choosing appropriate values for C1 and C2. Unfortunately, the conventional output stage 130 of amplifier 100 only provides proper impedance matching in a very narrow frequency range such as 20 MegaHertz range. This is very limiting because the amplifier 100 cannot be used for broadband applications.

It is further noted that it is common in the industry to operate circuitry at yet lower power supply voltages. For example, in near the future, it is expected that amplifiers operate based on 1.2 VDC instead of 1.8 VDC. The lower voltages make it even more difficult to achieve high gain from an amplifier.

Thus, there are challenges associated with implementing conventional amplifier circuits at lower voltages such as 1.2 VDC. For example, as previously discussed, operating conventional amplifiers at such low voltages causes reduced RF performance, negatively impacting parameters such as gain, noise figure, linearity, etc., of a respective amplifier. Additionally, as previously discussed, this disclosure includes the observation that conventional CMOS LNA implementations achieve only narrow band output matching, preventing such devices from being used in broadband applications.

In contrast to conventional approaches, embodiments herein include novel ways of providing improved performance of a multi-stage device.

For example, according to one embodiment, a multi-stage device includes multiple stages such as a first stage and a second stage. Typically, the stages of the multi-stage device take the form of circuitry. However, such resources can be instantiated in any suitable manner.

During operation, the first stage receives an input signal and outputs an intermediate signal based on the input signal. The second stage is coupled to the first stage to receive the intermediate signal and produce an output signal. In one example embodiment, the second stage includes: i) a transistor, and ii) a circuit path between the first stage and the transistor. In one embodiment, operation of the transistor derives the output signal from the intermediate signal inputted to the circuit path.

If desired, a combination of a bias voltage and/or the intermediate signal through a capacitor is applied to a gate of the transistor to control operation of the transistor and generation of the output signal.

In accordance with yet further embodiments, the gate of the transistor is controlled mainly via application of a DC bias voltage and the DC current (flow through the transistor).

In one embodiment, the intermediate signal is a radio frequency signal (AC signal), which varies the voltage inputted to the gate node of the transistor.

In accordance with another embodiment, at least a portion of current associated with the intermediate signal and inputted to the circuit path passes through the transistor to derive the output signal.

In one embodiment, the multi-stage device as described herein is an amplifier. In such an instance, the output signal is an amplified rendition of the input signal. The overall gain of the multi-stage device is indicated by dividing the magnitude of the output signal to the magnitude of the input signal. In one embodiment, the intermediate signal is an amplified rendition of the input signal. The output signal is an amplified rendition of the intermediate signal. In one embodiment, the amplification or gain of the output signal with respect to the intermediate signal is zero or fairly small. In such an instance, the input stage provides amplification of the input signal. The output stage serves as a buffer.

In accordance with further embodiments, the circuit path (or dual circuit path) in the multi-stage device couples a node of the first stage producing the intermediate signal to one or both of an input of the transistor (such as a gate node) and an output of the transistor (such as a source node).

In accordance with still further embodiments, the intermediate signal produced by the first stage and inputted to the circuit path controls operation of the transistor and corresponding flow of current through the circuit path. Such control of current produces the output signal from the second stage.

In one embodiment, the second stage of the multi-stage device is operable to use (or reuse) current associated with the intermediate signal outputted from the first stage to generate the output signal. As further discussed herein, use or reuse of the current from the first stage to produce the output signal from the second stage reduces power consumption of the multi-stage circuitry.

Further embodiments herein include a circuit path such as a capacitor coupling a node of the first stage outputting the intermediate signal to a gate node of the transistor.

Note that, if desired, the gate node of the transistor also can be biased via input of a bias voltage through a resistor to the gate of the transistor.

In accordance with further embodiments, the first stage includes a transistor operable to control an amount of current associated with the intermediate signal outputted to the second stage. In one embodiment, as further discussed below, the magnitude of current provided by the intermediate signal controls a gain associated with the multi-stage circuitry.

The multi-stage circuitry can include any number of passive components such as resistors, capacitors, and/or inductors. For example, in one embodiment, the second stage includes a first passive circuit component and a second passive circuit component disposed in series between a node of the first stage producing the intermediate signal and a node (such as a source node) of the transistor in the second stage. The output signal of the multi-stage device is derived from a circuit node coupling the first passive circuit component to the second passive circuit component.

As previously discussed, the multi-stage circuitry includes any number of circuit paths to provide connectivity between the node of the stage producing the intermediate signal and one or more nodes of the transistor. In one embodiment, the circuit path as described herein is a first circuit path from a node of the first stage to a gate node of the transistor. The multi-stage circuitry can be configured to further include a second circuit path between the node of the first stage producing the intermediate signal and a source node of the transistor.

In one embodiment, the first circuit path includes a capacitor coupling the node of the first stage outputting the intermediate signal to the gate node of the transistor.

In accordance with further embodiments, the second stage is implemented as a common drain circuit. With the new common drain output buffer stage as described herein, it is possible to achieve higher gain and a broadband output matching using the second stage.

Further, as previously discussed, in one embodiment, the multi-stage device is an amplifier circuit for use in any suitable application. For example, in one nonlimiting example embodiment, an apparatus (such as a communication device) includes one or more versions of the multi-stage device as described herein. In one embodiment, the apparatus includes an antenna to receive a wireless signal. The antenna converts the wireless signal into the input signal that is inputted to the first stage of the multi-stage device. In a manner as described herein, the multi-stage device amplifies the input signal into the output signal.

In accordance with further embodiments, an impedance of the second stage is matched (or substantially matched) to an impedance of the first stage. In one embodiment, the impedance of the second stage is substantially matched to the impedance of the first stage over a broadband frequency range such as between 1 and 3 Gigahertz or any other frequency range.

Further embodiments herein include implementing the second stage of the multi-stage device as a common drain amplifier circuit to amplify the input signal into the output signal.

Embodiments herein further include methods of receiving an input signal and producing an output signal. For example, in one embodiment, the method includes: receiving an input signal; generating an intermediate signal from the input signal; outputting the intermediate signal over a first circuit path to a transistor; and controlling operation of the transistor to derive an output signal from the intermediate signal. In one embodiment, as previously discussed, the method includes producing the output signal to be an amplified rendition of the input signal.

In accordance with one embodiment, controlling operation of the transistor includes: utilizing the intermediate signal as input (such as through a capacitor) to control an input node (such as a gate node) of the transistor and corresponding flow of current through the transistor to produce the output signal.

In accordance with further embodiments, outputting the intermediate signal includes: outputting the intermediate signal to a first circuit component of the second stage, the first component and a second circuit component disposed in series between a node of the first stage produces the intermediate signal inputted to a node (such as source node) of the transistor. Yet further embodiments herein including outputting the output signal over a circuit path such as from a third circuit component coupled to a circuit node coupling the first circuit component to the second circuit component.

Further embodiments herein include inputting the intermediate signal generated by the first stage over a circuit path coupled to an input node (such as a gate node) of the transistor. If desired, the method can also include inputting the intermediate signal generated by the first stage over the first circuit path coupled to an output node (such as a source node) of the transistor.

In accordance with still further embodiments, to reduce power consumption, the method as described herein can include utilizing current associated with the intermediate signal outputted from the first stage to generate the output signal.

In accordance with yet further embodiments, the method is implemented in a wireless device. In such an instance, the method further includes: receiving a wireless signal at an antenna; and producing the input signal inputted to the first stage based on the received wireless signal.

Note that further embodiments herein include an improved multi-stage amplifier device and method to improve the "High Gain Mode" performance of a LNA circuit with matching impedance. In one embodiment, the matching inductor components in the multi-stage device require a very high quality factor to have less impact on the LNA key parameter noise figure.

These and other more specific embodiments are disclosed in more detail below.

Note further that although embodiments as discussed herein are applicable to amplifier circuitry, the concepts disclosed herein may be advantageously applied to any other suitable topologies.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

FIG. 6C is an example diagram illustrating equations to calculate Rout for the simplified circuit of FIG. 6B according to embodiments herein.

Figure 1:
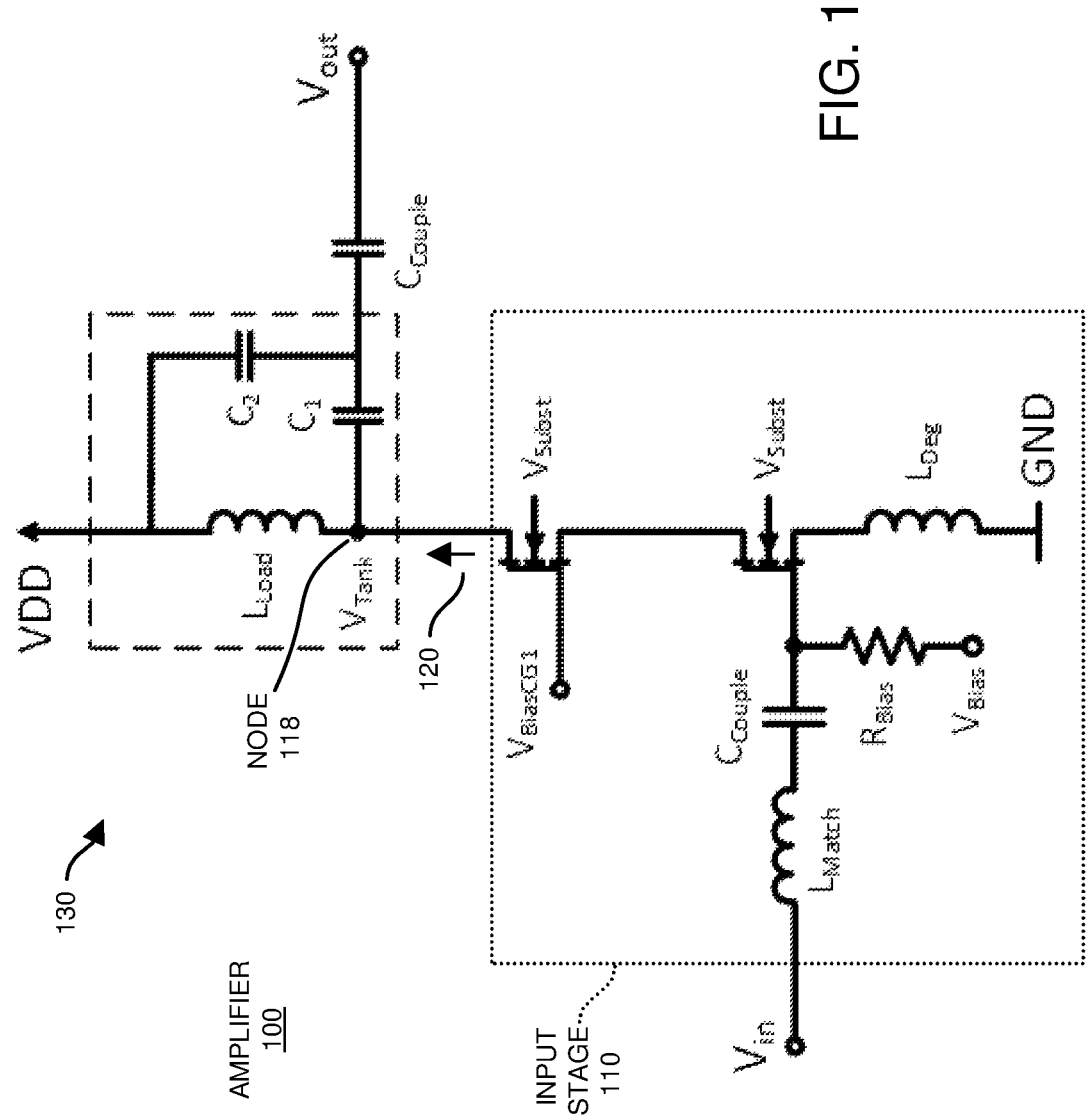
FIG. 1 is an example diagram illustrating a multi-stage amplifier device according to conventional techniques.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Embodiments herein include an apparatus amplifier comprising: a first stage to receive an input signal, the first stage producing an intermediate signal based on the input signal; and a second stage coupled to the first stage to receive the intermediate signal and produce an output signal. The second stage includes: i) a transistor, and ii) a circuit path between the first stage and the transistor. The intermediate signal is inputted to the circuit path to derive the output signal from the intermediate signal.

Figure 2:
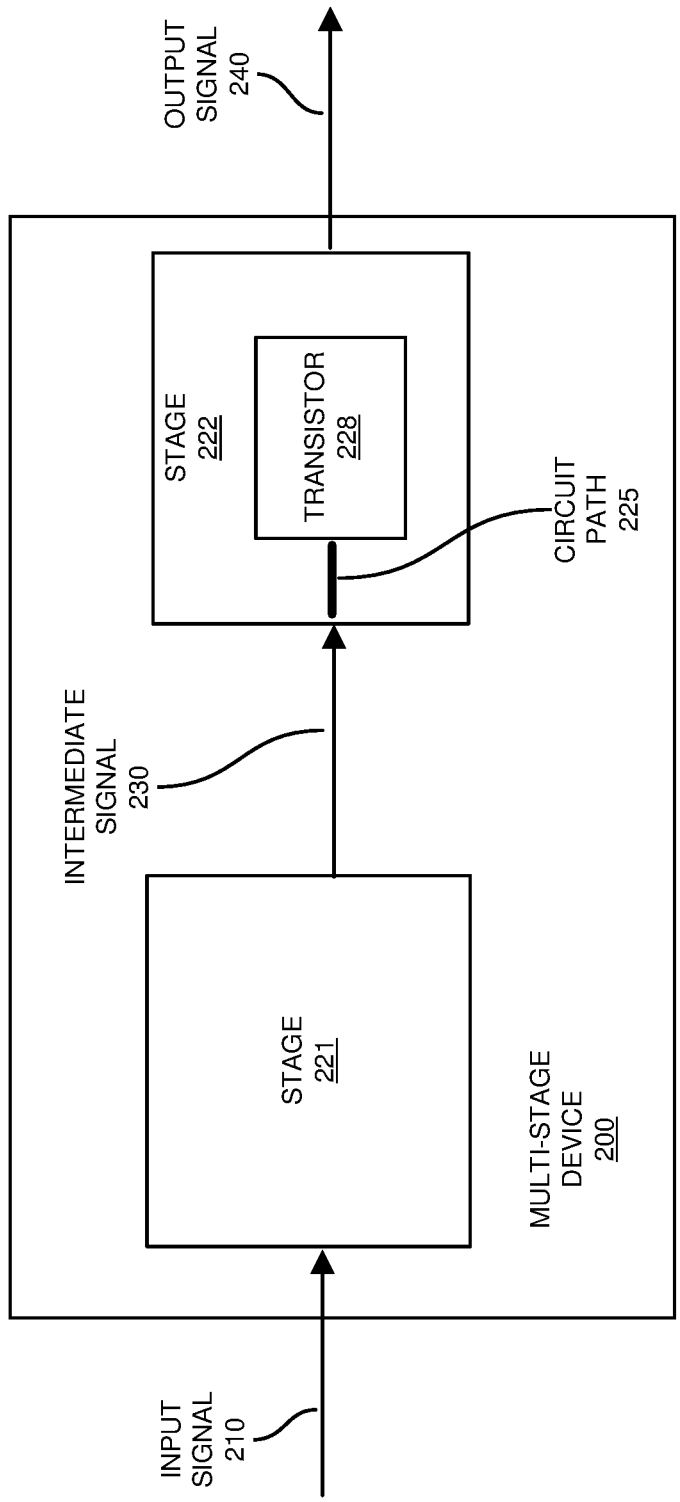
FIG. 2 is an example diagram illustrating implementation of a multi-stage device according to embodiments herein.

Now, more specifically, FIG. 2 is an example diagram illustrating a novel multi-stage device according to embodiments herein. By way of non-limiting example embodiment, the multi-stage device as described herein is a multi-stage amplifier device. For instance, the multi-stage device is a low-noise amplifier or so-called LNA device, apparatus, circuit, etc.

As shown, in this example embodiment, multi-stage device 200 includes any number of stages.

For example, in one embodiment, the multi-stage device 200 includes stage 221 (such as an input stage) and stage 222 (such as an output buffer or output stage). As further shown, stage 222 includes circuit path 225 and transistor 228.

As previously discussed, typically, each of the stages and corresponding of the multi-stage device 200 take the form of hardware such as circuitry. However, such resources can be instantiated in any suitable manner.

In one embodiment, the transistor 228 is an N-channel CMOS (Complementary Metal Oxide Semiconductor) component in which the substrate is connected to $V_{SUBSTRATE}$. However, note that transistor 228 can be any suitable transistor (field effect transistor, bipolar junction transistor, etc.) or switch device supporting functionality herein.

During operation, the first stage 221 (such as tank or resonant circuit) receives an input signal 210 and outputs an intermediate signal 230 based on the input signal 210. As shown, the second stage 222 (such as another tank or resonant circuit) is coupled to the first stage 221 to receive the intermediate signal 230.

In one embodiment, the second stage includes: i) a transistor 228, and ii) a circuit path 225 disposed between the first stage 221 and the transistor 228. As further discussed herein, the intermediate signal 230 is inputted to the circuit path 225 to control the transistor 228 and/or derive the output signal 240 from the intermediate signal 230. As further discussed below, embodiments herein further include applying a bias voltage to the transistor 228 to control its operation or state.

In embodiments in which the multi-stage device 200 is an amplifier (such as a low noise amplifier circuit), the output signal 240 is an amplified rendition of the input signal 210.

As a further example, in one embodiment, note that the intermediate signal 230 is an amplified rendition of the input signal 210. The output signal 240 is an amplified rendition of the intermediate signal 230. As previously discussed, the amplification or gain of the output signal with respect to the intermediate signal can be chosen to be zero or fairly small. In other words, the amount of gain provided by the stage 222 may be small or zero. In such an instance, the input stage 221 supplies most or all of the gain associated with the multi-stage device 200.

In accordance with further embodiments, the circuit path 225 couples a node of the first stage producing the intermediate signal 230 to one or more nodes (such as input and/or output nodes) of the transistor 228.

More specifically, as further discussed herein, the circuit path 225 can be configured to provide connectivity from the stage 221 to a gate node (input node) of the transistor 228; the circuit path 225 can be configured to provide connectivity from the stage 221 to a source node of the transistor 228.

In accordance with still further embodiments, the intermediate signal 230 produced by the first stage 221 and inputted to the circuit path 225 controls operation of the transistor 228 and corresponding flow of current through the circuit path 225. Such control of the current through the circuit path 225 produces the output signal 240 outputted from the second stage 222.

As further discussed herein, in one embodiment, the second stage 222 is operable to use or reuse the current associated with the intermediate signal 230 outputted from the first stage 221 to generate the output signal 240. Use or reuse of the current from the first stage 221 to produce the output signal 240 from the second stage as further discussed herein reduces power consumption of the multi-stage device 200 when converting the input signal 210 into the output signal 240.

Figure 3:
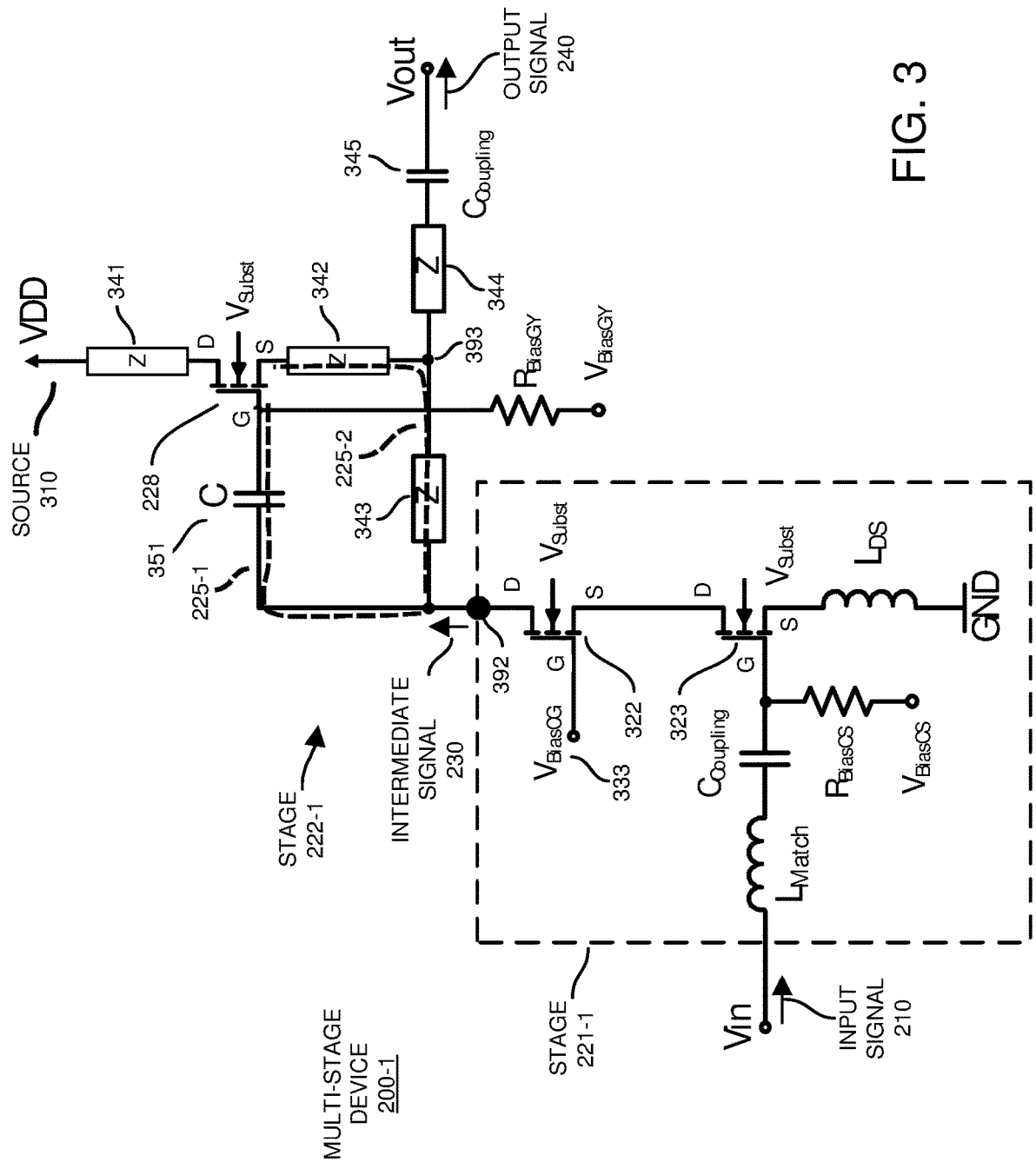
FIG. 3 is an example diagram illustrating a more specific implementation of a multi-stage amplifier circuit according to embodiments herein.

FIG. 3 is an example diagram illustrating a more specific implementation of a multi-stage device according to embodiments herein.

In this example embodiment, the multi-stage device 200-1 (such as an amplifier circuit) includes stage 221-1 and stage 222-2. As previously discussed, the multi-stage device 200-1 can include any number of stages.

Typically, each of the stages and corresponding of the multi-stage device 200-2 take the form of hardware such as circuitry. However, such resources can be instantiated in any suitable manner.

As shown in this example embodiment, the input stage 221-1 of multi-stage device 200-1 includes transistor 322, transistor 323, inductor Lmatch, capacitor Ccoupling, resistor RbiasCS, and inductor Lds.

In this example embodiment, as shown in stage 221-1, the input signal 210 is inputted to a circuit path including a series combination of inductor Lmatch and capacitor Ccoupling connected to the gate node of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to the node 392; the source node (S) of the transistor 322 is coupled to the drain node (D) of transistor 323; the inductor LDS couples the source node (S) of the transistor 323 to the ground reference (GND). As further shown, the output stage 222-1 (or output buffer) of multi-stage device 200-1 includes capacitor 351, power supply $V_{DD}$, component 341, component 342, component 343, component 344, transistor 228, resistor RbiasGY, and capacitor 345.

Further in this example embodiment, as shown in stage 222-1, the capacitor 351 provides connectivity between node 392 and the gate node of the transistor 228. The resistor $R_{BIASGY}$ receives input voltage $V_{BIASGY}$ and is coupled to the gate node of transistor 228. Component 341 couples power source 310 (such as voltage VDD) to the drain node (D) of the transistor 228; component 342 couples a source node (S) of the transistor 342 to node 393; component 343 couples node 392 to node 393; a series combination of component 344 and capacitor 345 couples node 393 to the output of the multi-stage device 200-1 producing the output signal 240.

As previously discussed, the input signal 210 (Vin) is inputted to the input stage 221-1 (such as a single cascode in this example).

Input stage 221-1 is tuned to convert the input signal 210 into the intermediate signal 230 outputted at node 392. Stated differently, the input signal 210 (Vin) controls at least operation of the transistor 323 (which is controlled to be in a correct or desired DC bias state) in the stage 221-1 to produce the intermediate signal 230 outputted from node 392 of the first stage 221-1 to the second stage 222-1.

In one embodiment, the transistor 323 is an N-channel CMOS (Complementary Metal Oxide Semiconductor) component in which the substrate is connected to reference voltage $V_{SUBSTRATE}$. However, note that transistor 323 can be any suitable transistor (field effect transistor, bipolar junction transistor, etc.) or switch device supporting functionality herein.

As further shown, note that the first stage 221-1 can be configured to include transistor 322 to control an amount of current associated with the intermediate signal 230 (such as a radio frequency signal) outputted to the second stage 222-1. Transistor 323 controls a flow of DC current through the multi-stage device to ground reference (GND).

In one embodiment, the transistor 322 is an N-channel CMOS (Complementary Metal Oxide Semiconductor) component in which the substrate is connected to reference voltage $V_{SUBSTRATE}$. However, note that transistor 322 can be any suitable transistor (field effect transistor, bipolar junction transistor, etc.) or switch device supporting functionality herein.

More specifically, in one embodiment, input voltage 333 (i.e., VbiasCG, such as a DC voltage value), is applied to the gate (G) of transistor 322 in stage 221-1. The voltage VbiasCG is set to an appropriate DC bias voltage to control the radio frequency performance of transistor 322. As described herein, the magnitude of current provided by the intermediate signal 230 to the stage 222-1 is one parameter to control a gain associated with the multi-stage device 200-1. More specifically, in one embodiment, one chooses a proper setting of the DC voltage of VbiasCG to obtain most desired gain and linearity performance, which is dependent from the whole circuitry Thus, the setting of voltage VBiasCG is one way to control gain associated with the multi-stage device 100.

Note that the impedance settings of components 341, 342, 343, 344 (such as comprising one or more different types of passive components) in stage 222-1 can be any suitable simple of complex impedance value. As further discussed below, the settings of these components control different parameters associated with the stage 322.

In certain instances, embodiments herein include setting one or more respective components (341, 342, 343, 344) to zero ohms (i.e., short circuit). Alternatively, any of these components can be set to a complex impedance value. In one embodiment, setting of one or more components to zero ohms would be the best solution for 1.2 VDC $V_{DD}$ supply voltage to achieve high performance.

As previously discussed, the multi-stage device 200-1 can include any number of passive components such as resistors, capacitors, and/or inductors.

Multi-stage device 200-1 includes any number of one or more circuit paths coupling the node 392 of stage 221-1 to the transistor 228.

For example, in one embodiment, the second stage 222-1 includes circuit path 225-1 (such as including capacitor 351) coupling the node 392 to the gate node (G) of the transistor 228. The intermediate signal 230 inputted to the circuit path 225-1 and gate of transistor 228 controls the current through transistor 228, which is in the appropriate DC bias state.

The second stage 222-1 further includes circuit path 225-2. Circuit path 225-2 includes component 343 and component 342 disposed in series between node 392 of the first stage 221-1 and a node (output node such as a source node S) of the transistor 228 in the second stage 222-1. As further discussed herein, the circuit path 225-2 provides at least a partial path over which to convey the current sourced from power supply $V_{DD}$ and passing through the transistor 228. In one embodiment, at least a portion of DC current associated with the intermediate signal 230 (such as network RF signal) inputted to the circuit path 225-2 passes internally through the transistor 228 (such as from its drain to source or from its source to drain) and component 341 to reference voltage $V_{DD}$ to derive the output signal 240. In accordance with further embodiments, the DC current flows mainly over circuit path 225-2.

Further in this example embodiment, the output signal 240 (such as voltage Vout) is derived from node 393, a voltage of which is based at least in part on the intermediate signal 230 inputted to the circuit path 225-2.

In general, in one embodiment, the value of component 342 is selected to match the overall impedance of stage 222-1 to the impedance of stage 221-1 (such as around 50 ohms or other suitable value). The impedance value chosen for component 343 generally controls or adjusts a gain of stage 222-1.

As further shown, and as previously discussed, capacitor 351 provides coupling of node 392 of the first stage 221-1 outputting the intermediate signal 230 to a gate node (G) of the transistor 228. Note that the size/value/setting chosen for the capacitor 351 impacts a gain and impedance associated with stage 222-1.

More specifically, the intermediate signal 230 inputted to the circuit path 225-2 passes through component 351 (capacitor) to the gate node (G) of transistor 228. The capacitance of component 351 can be any suitable value. A higher capacitance value for component 351 results in higher gain provided by multi-stage device 200-1; a lower capacitance value for component 351 results in lower gain provided by multi-stage device 200-1.

In general, the impedance value or setting of component 343 is chosen to control gain of the multi-stage device 200-1. For example, the higher the impedance (such as inductance) value for component 343, the higher the gain; the lower the impedance (such as inductance) value for component 343, the lower the gain.

Note further that the channel width (and generally corresponding drain-source conductance) associated with transistor 228 also can be used to control overall gain of the multi-stage device 200-1 as well. For example, the larger the width of the transistor 228, the lower the gain provided by stage 222-1; the smaller the width, the higher the gain provided by stage 222-1.

Application of $V_{BIASGY}$ through resistor $R_{BIASGY}$ to the gate node of the transistor 228 biases the gate node (G) of transistor 228 to set the transistor 228 into a desired working point/state. In one embodiment, the setting of voltage $V_{BIASGY}$ is controlled to provide appropriate linearity for the stage 222-1.

During operation, as previously discussed, the input (such as the voltage at the gate node of transistor 228 or intermediate signal 230 passing through component 351) to the gate of transistor 228 controls the state of the transistor 228 and the flow of the DC current, which flows mainly over the circuit path from voltage source 310 ($V_{DD}$) through a combination of component 341, drain to source of transistor 228, component 342, component 343, drain to source of transistor 322, drain to source of transistor 323, and inductor Lis to the ground reference (GND).

As previously discussed, and as shown, the output signal 240 is derived from the voltage at node 393. In one embodiment, as shown, the output of the multi-stage device 200-1 producing the output signal 240 includes a series connection of component 344 and capacitor 345.

Note that further embodiments herein include implementing a combination of the first stage 221-1 and the second stage 222-1 of the multi-stage device 200-1 as a common drain amplifier circuit to amplify the input signal 210 into the output signal 240. Thus, in one embodiment, the second stage 222-1 is a common drain circuit (for example, drain of transistor 228 is coupled to the supply voltage $V_{DD}$). Via the example common drain output buffer stage (stage 222-1), embodiments herein include providing higher gain and impedance output matching of stage 221-1 and stage 222-1 over a broadband frequency range in comparison to conventional circuits and techniques as previously discussed with respect to FIG. 1.

More specifically, referring again to FIG. 3, an output impedance of the second stage 222-1 is matched (or substantially matched) to an output impedance of the first stage 221-1. In one embodiment, the impedance of the second stage 222-1 can be substantially matched to the impedance of the first stage 221-1 over a frequency range greater than 1.5 GHz or any other suitable value. As previously discussed, the wider the range in which the stages are matched, the better the ability of the multi-stage device 200-1 to operate in broadband applications.

In one embodiment, the as discussed below in FIG. 4, the multi-stage device 200-1 provides impedance matching between 1 and 3 Gigahertz or any other frequency range.

Referring again to FIG. 3, as previously discussed, the input stage 221-1 can be a single cascode. However, note that the output buffer stage (stage 222-1) be used in combination with any suitable type of input stage (such as common source for lower gain, or <1.2 VDC $V_{DD}$ supply voltage, dual cascode stage for higher gain or >1.8 VDC $V_{DD}$ supply voltage).

Embodiments herein are useful over conventional amplifiers. For example, the novel multi-stage device 200-1 supports:

Higher gain with less cascode stages (which may be important for low voltage <1.2 VDC LNAs)
Output impedance matching of stages over a wide range
Lower process variation impact (no S22 frequency shift)
Broadband application area (only changing external matching)
Reduced semiconductor chip area (circuit size) on a respective substrate implementing the multi-stage device 200
High reduction of LNA developing time and expense
Developing of 1 generic LNA which is useable for many frequency bands The stage 222-1 (such as an output buffer stage) can be used with several input stages:

Common source stage
Multiple cascode stage

Figure 4:
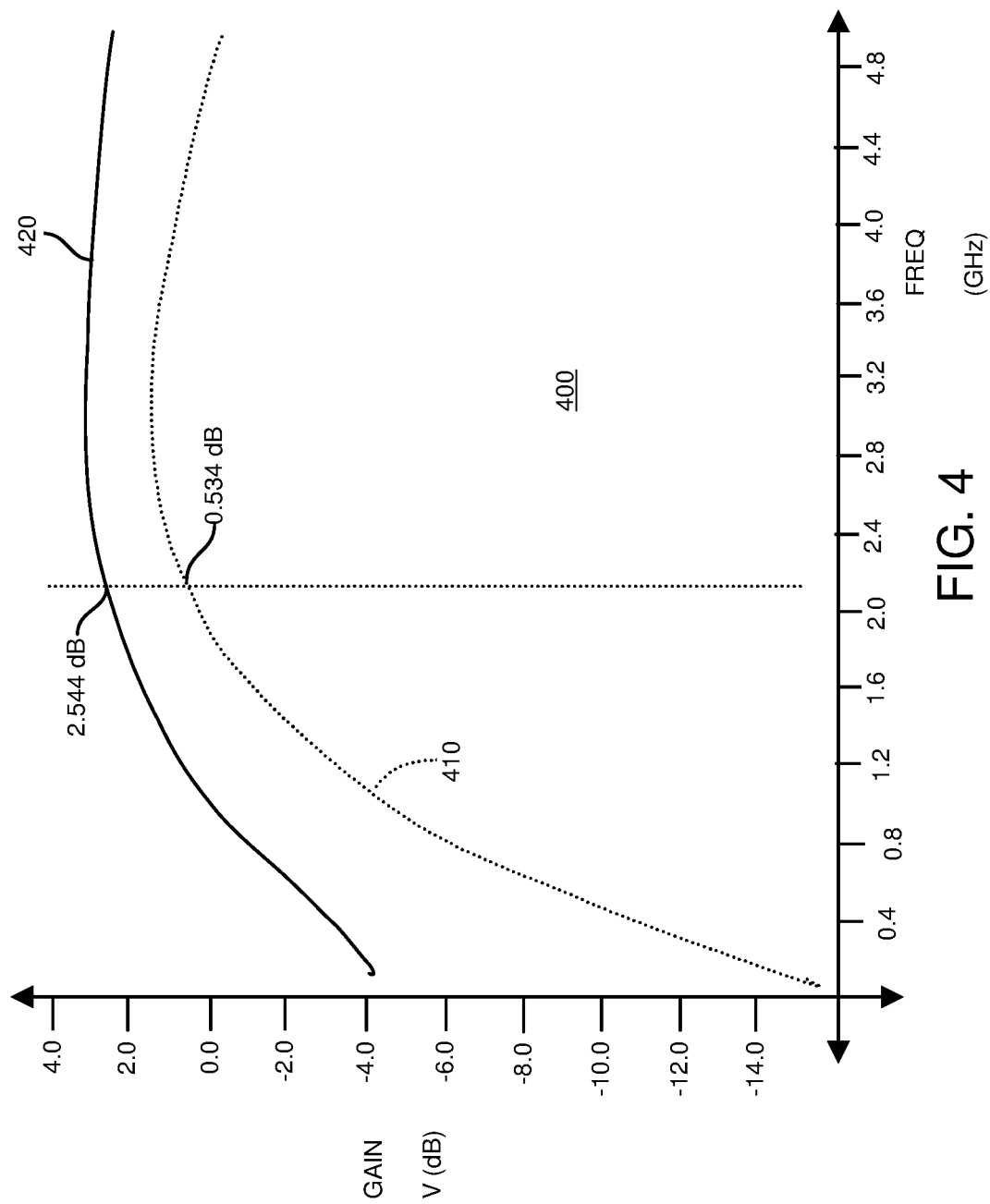
FIG. 4 is an example diagram illustrating a theoretical difference in gain provided by a conventional circuit (such as in FIG. 1) versus gain provided by a multi-stage device (such as in FIG. 3) according to embodiments herein.

FIG. 4 is an example diagram illustrating a theoretical difference in gain provided by a conventional amplifier circuit versus a multi-stage device according to embodiments herein.

According to the graph 400 in FIG. 4, the conventional amplifier circuit 100 in FIG. 1 provides hypothetical gain 410 over a range of frequencies from 0 to 5 GHz. In contrast, the improved multi-stage device 200 (200-1) in FIGS. 2 and 3 provides hypothetical gain 420 over a range of frequencies from 0 to 5 GHz.

Thus, the multi-stage device 200 according to embodiments herein provides higher gain than the conventional amplifier circuit 100.

It is also noted that, at lower operating frequencies, the multi-stage device 200 provides much higher gain than the conventional amplifier 100. This indicates it is possible to reduce semiconductor chip area of a respective circuit implementing the multi-stage device 200 because the inductor value which is needed in LB frequencies is much lower (such as 3 nH to >10 nH) as compared to inductors needed to implement the conventional amplifier 100 (for example, combination of cascode input stage and capacitive voltage divider C1 and C2) output stage.

Figure 5:
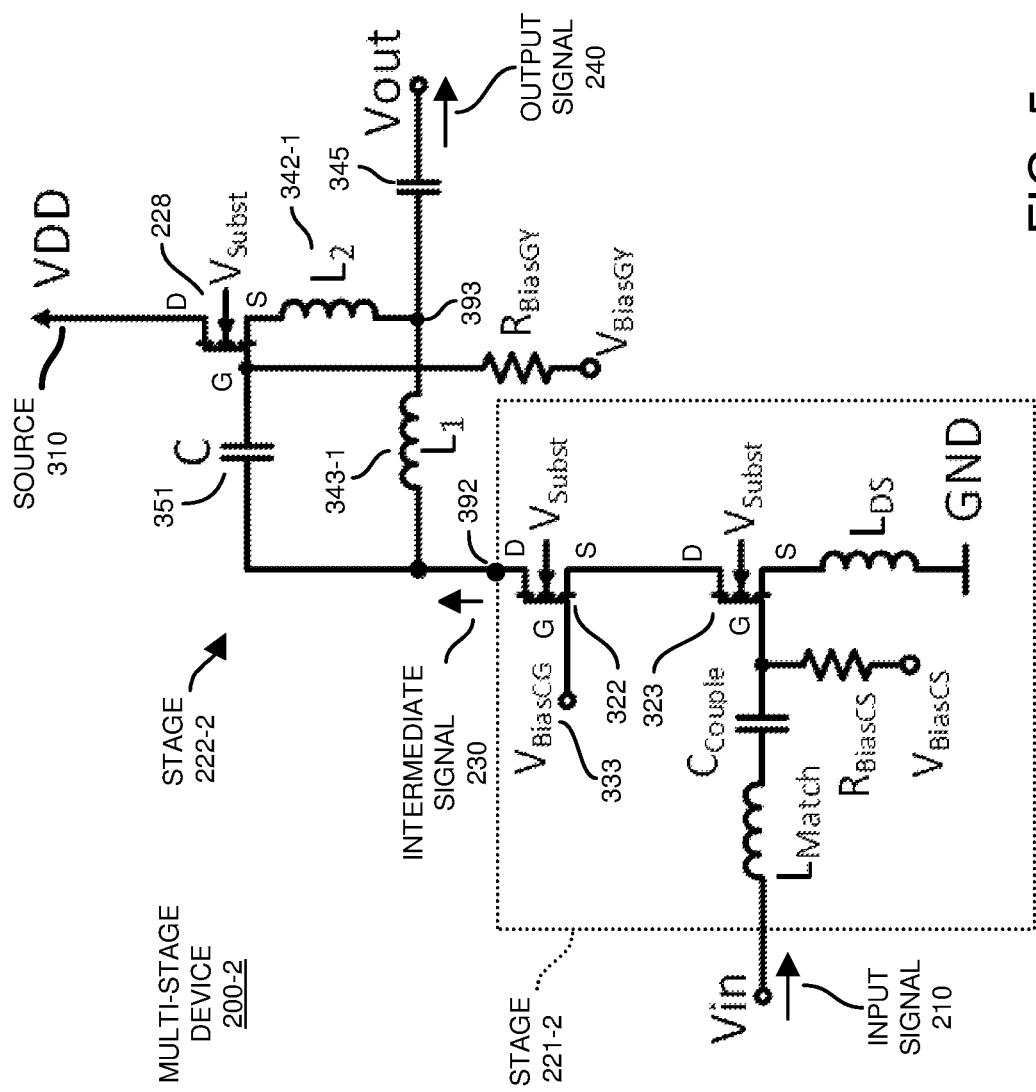
FIG. 5 is an example diagram illustrating an implementation of a multi-stage amplifier circuit using multiple inductor components according to embodiments herein.

FIG. 5 is an example diagram illustrating an implementation of a multi-stage amplifier circuit according to embodiments herein.

As shown in this example embodiment, the input stage 221-2 of multi-stage device 200-2 includes transistor 322, transistor 323, inductor Lmatch, capacitor Ccoupling, resistor RbiasCS, and inductor Lds.

In this example embodiment, as shown in stage 221-2, the input signal 210 is inputted to a circuit path including a series combination of inductor Lmatch and capacitor Ccoupling connected to the gate node of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to the node 392; the source node (S) of the transistor 322 is coupled to the drain node (D) of transistor 323; the inductor LDS couples the source node (S) of the transistor 323 to the ground reference (GND).

As further shown, the output stage 222-2 (or output buffer) of multi-stage device 200-2 includes capacitor 351, power supply $V_{DD}$, component 342-1 (such as inductor L2), component 343-1 (such as inductor L1), transistor 228, resistor RbiasGY, and capacitor 345.

Further in this example embodiment, as shown in stage 222-2, the capacitor 351 provides connectivity between node 392 and the gate node of the transistor 228. The resistor $R_{BIASGY}$ receives input voltage $V_{BIASGY}$ and is coupled to the gate node of transistor 228. The power source 310 (VDD) is connected directly to the drain node (D) of the transistor 228; component 342-1 (such as inductor L2) couples a source node (S) of the transistor 228 to node 393; component 343-1 (such as inductor L1) couples node 392 to node 393; component 345 (such as a capacitor) couples node 393 to the output of the multi-stage device 200-2 producing the output signal 240.

In this example embodiment, the power supply VDD (power source 310) is directly connected to the drain (D) of transistor 228. For example, component 341 (as previously discussed with respect to FIG. 3) is a short circuit or near zero ohm connection.

As further shown, the component 342-1 is instantiated as inductor L2; the component 343-1 is instantiated as inductor L1.

In general, in one embodiment, the value of inductor L1 (component 343-1) is chosen to control gain of the multi-stage device 200-2. For example, the higher the inductance value or setting for L1, the higher the gain of the multi-stage device 200-2; the lower the inductance value for L1, the lower the gain of the multi-stage device 200-2.

In general, in one embodiment, the value or setting of inductor L2 (component 342-1) is chosen to control the output impedance of the second stage 222-2 of the multi-stage device 200-2.

Figure 6A:
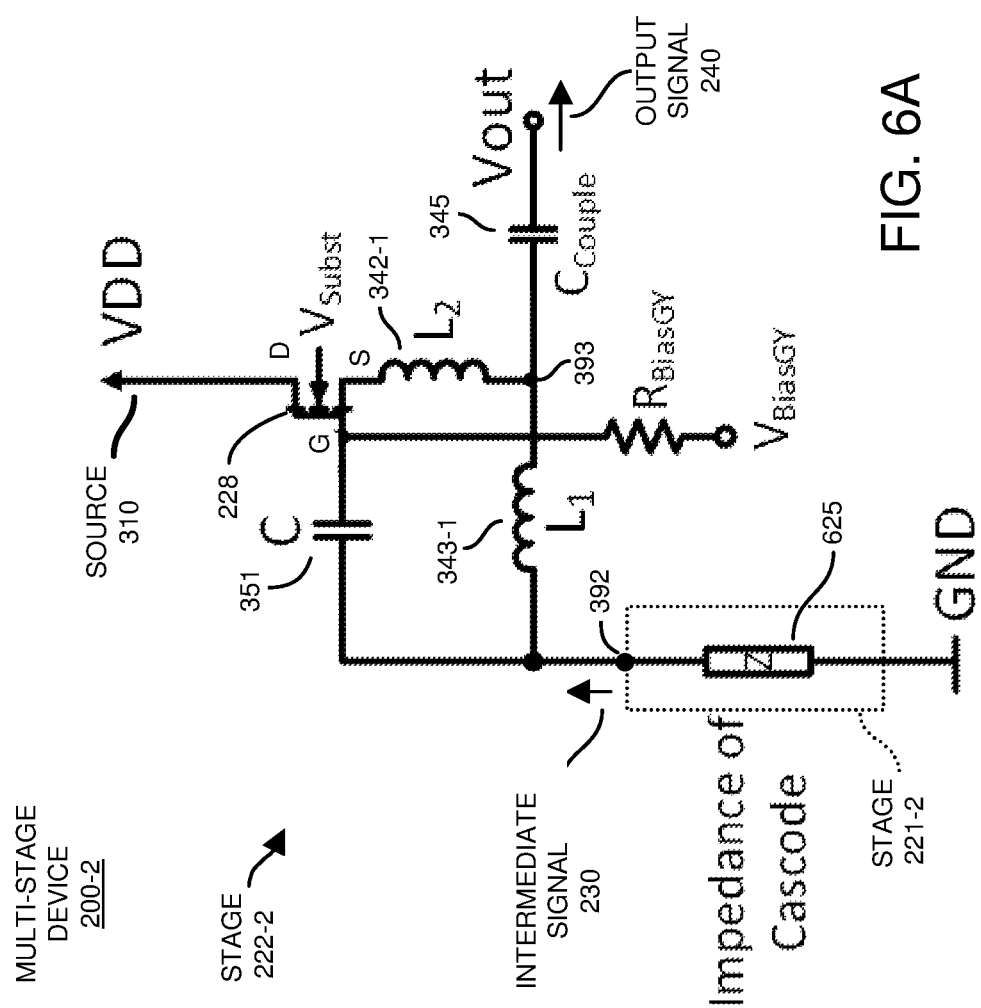
FIG. 6A is an example diagram illustrating a simplified view of the multi-stage amplifier circuit in FIG. 5 according to embodiments herein.

To calculate the output matching (Rout) and the voltage/power-gain (Av) for the multi-stage device 200-2, it may be advantageous to replace the stage 221-2 (such as a cascode) with an overall impedance value 625 as shown in FIG. 6. In other words, the multi-stage device 200-2 in FIG. 6A is a simplification of the multi-stage device 200-2 in FIG. 5.

FIG. 6A is an example diagram illustrating simplification of a multi-stage amplifier circuit according to embodiments herein.

In this example embodiment, the input stage 221-2 is simplified to be impedance 625. This simplified circuit of multi-stage device 200-2 can be used to calculate Rout of the stage 222-2, such as using the small signal replacement circuit as further shown in FIG. 6B.

Figure 6B:
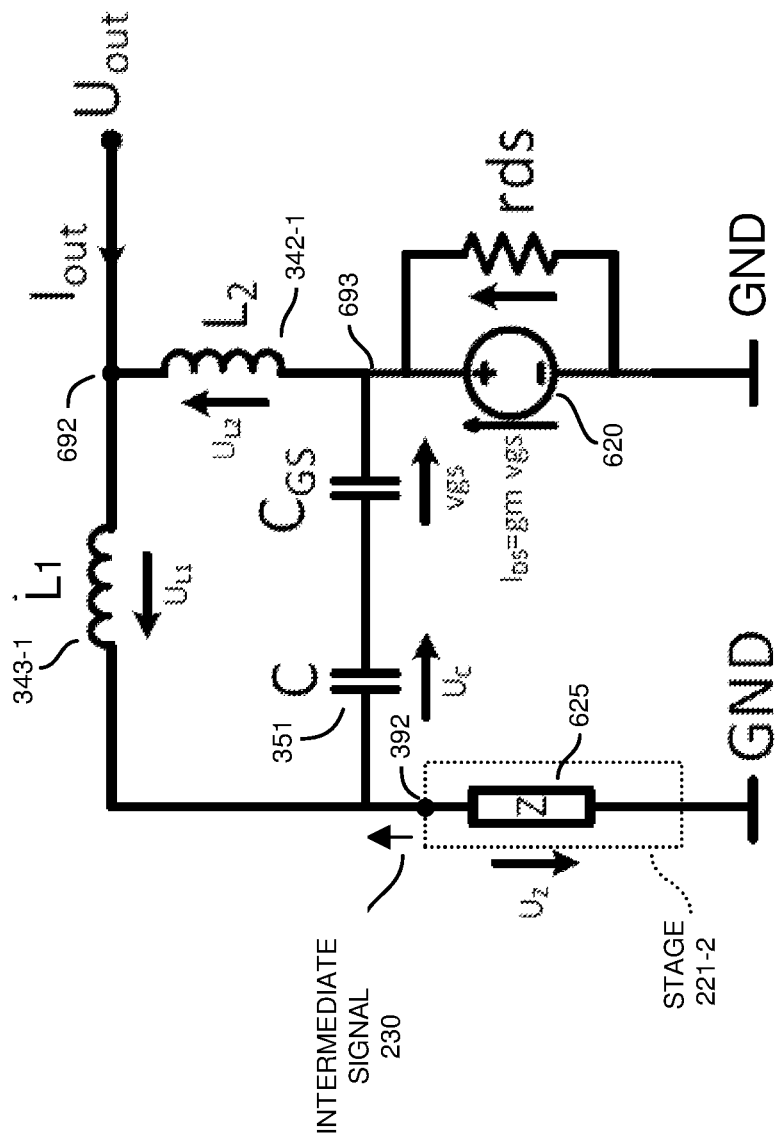
FIG. 6B is an example diagram illustrating a replacement circuit to perform small signal analysis of the multi-stage amplifier circuit in FIG. 6A according to embodiments herein.

FIG. 6B is an example diagram illustrating a simplification of a multi-stage amplifier circuit according to embodiments herein.

If desired, one may insert the small signal replacement circuit (for the stage 222 as shown in FIG. 6B) to perform simulations and to verify broadband output matching of the impedance 625 associated with the input stage 221-2 and impedance of the output stage 222-2.

As shown in this example embodiment, the impedance 625 is coupled between the node 392 and ground reference (GND). Capacitor 351 is coupled in series with capacitor $C_{GS}$ between node 392 and node 693. Inductor L2 is coupled between node 693 and node 692. Inductor L1 is connected between node 692 and node 392. Resistor rds is connected in parallel with source 620 between node 693 and ground reference (GND).

FIG. 6C is an example diagram illustrating equations to calculate Rout for the simplified circuit of FIG. 6B according to embodiments herein.

In one embodiment, calculation of the small signal replacement circuit $R_{out}$ is as follows:

$$I_{DS} = gm \; vgs$$

$$I_{CGS} = vgs \; s \; C_{GS}$$

$$U_C = vgs \frac{C_{GS}}{C}$$

Meshs:

$$0 = -U_{L2} - U_{rds} - U_{out}$$

$$0 = -U_Z - U_C + vgs - U_{rds}$$

$$0 = -U_{out} - U_Z + U_C + vgs - U_{L2}$$

$$0 = -U_{L2} - U_Z - U_{out}$$

nodes:

$$0 = -I_{out} - I_{L1} - I_{L2}$$

$$0 = -I_{L2} + I_{CGS} + I_{DS} + I_{rds}$$

$$0 = -I_Z - I_{L1} - L_{CGS}$$

As previously discussed, see FIG. 6C for equations to calculate Rout.

Figure 7:
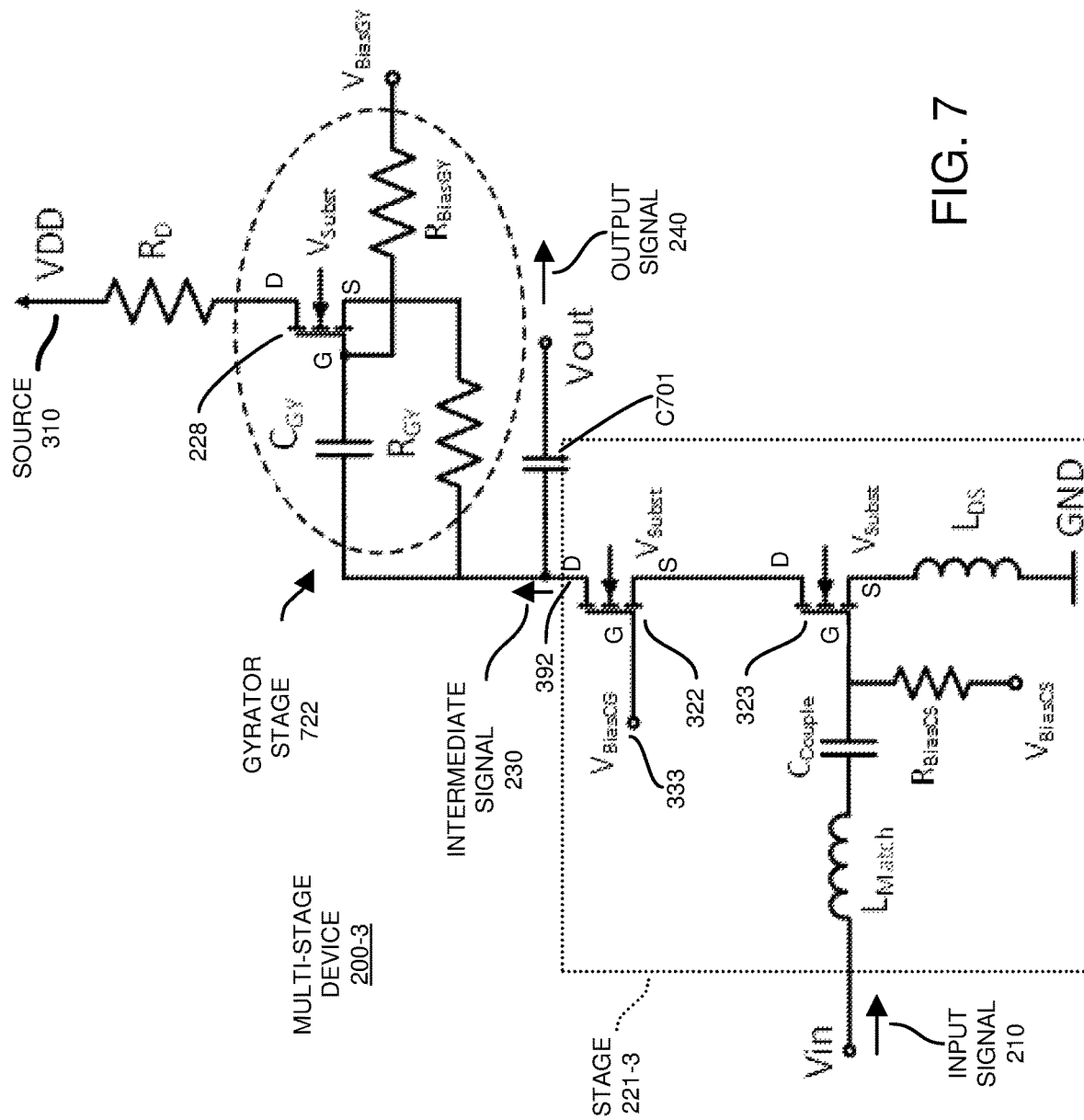
FIG. 7 is an example diagram illustrating an implementation of a multi-stage amplifier circuit according to embodiments herein.

FIG. 7 is an example diagram illustrating an implementation of a multi-stage amplifier circuit according to embodiments herein.

As shown in this example embodiment, the input stage 221-3 of multi-stage device 200-3 includes transistor 322, transistor 323, inductor Lmatch, capacitor Ccouple, resistor $R_{BIASCS}$, and inductor $L_{DS}$.

In this example embodiment, as shown in stage 221-3, the input signal 210 is inputted to a circuit path including a series combination of inductor Lmatch and capacitor Ccouple connected to the gate node of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to the node 392; the source node (S) of the transistor 322 is coupled to the drain node (D) of transistor 323; the inductor Lis couples the source node (S) of the transistor 323 to the ground reference (GND).

As further shown, the gyrator stage 722 (or output buffer) of multi-stage device 200-3 includes capacitor $C_{GY}$, power source 310 (such as $V_{DD}$), resistor $R_D$, transistor 228, resistor $R_{GY}$, capacitor C701, and resistor $R_{BIASGY}$.

Further in this example embodiment, as shown in gyrator stage 722, the resistor $R_D$ provides connectivity between source 310 and a drain node (D) of the transistor 228. The resistor $R_{GY}$ couples the source node (S) of the transistor 228 to the node 392. Capacitor $C_{GY}$ couples the node 392 to the gate node (G) of the transistor 228. The resistor RBIASGY receives input voltage $V_{BIASGY}$ and is coupled to the gate node (G) of transistor 228. Capacitor C701 coupled to node 392 provides circuit path from which to output the output signal 240 from the multi-stage device 200-3.

In this example embodiment, the multi-stage device 200-3 is implemented based on a so-called Gyrator principle (i.e., active inductor). Thus, the multi-stage device 200-3 includes implementing the second stage 222 as gyrator stage 722.

As shown, the gyrator stage 722 in this example embodiment includes capacitor $C_{GY}$, resistor $R_{GY}$, transistor 228, and resistor $R_{BIASGY}$. During operation in this embodiment, the multi-stage device 200-3 outputs the output signal 240 from node 392 through capacitor C701. Similar to other embodiments as previously discussed, the output signal 240 is an amplified rendition of the input signal 210.

In one nonlimiting example embodiment, implementing the second stage of the multi-stage device 200 as a gyrator stage 722 (as shown in FIG. 7) reduces a footprint of a corresponding semiconductor chip on which the multi-stage device 200-3 is fabricated. However, the overall performance of the multi-stage device 200-3 may be lower compared to the implementations of the stage 222 using inductor coils as in prior embodiments.

Figure 8:
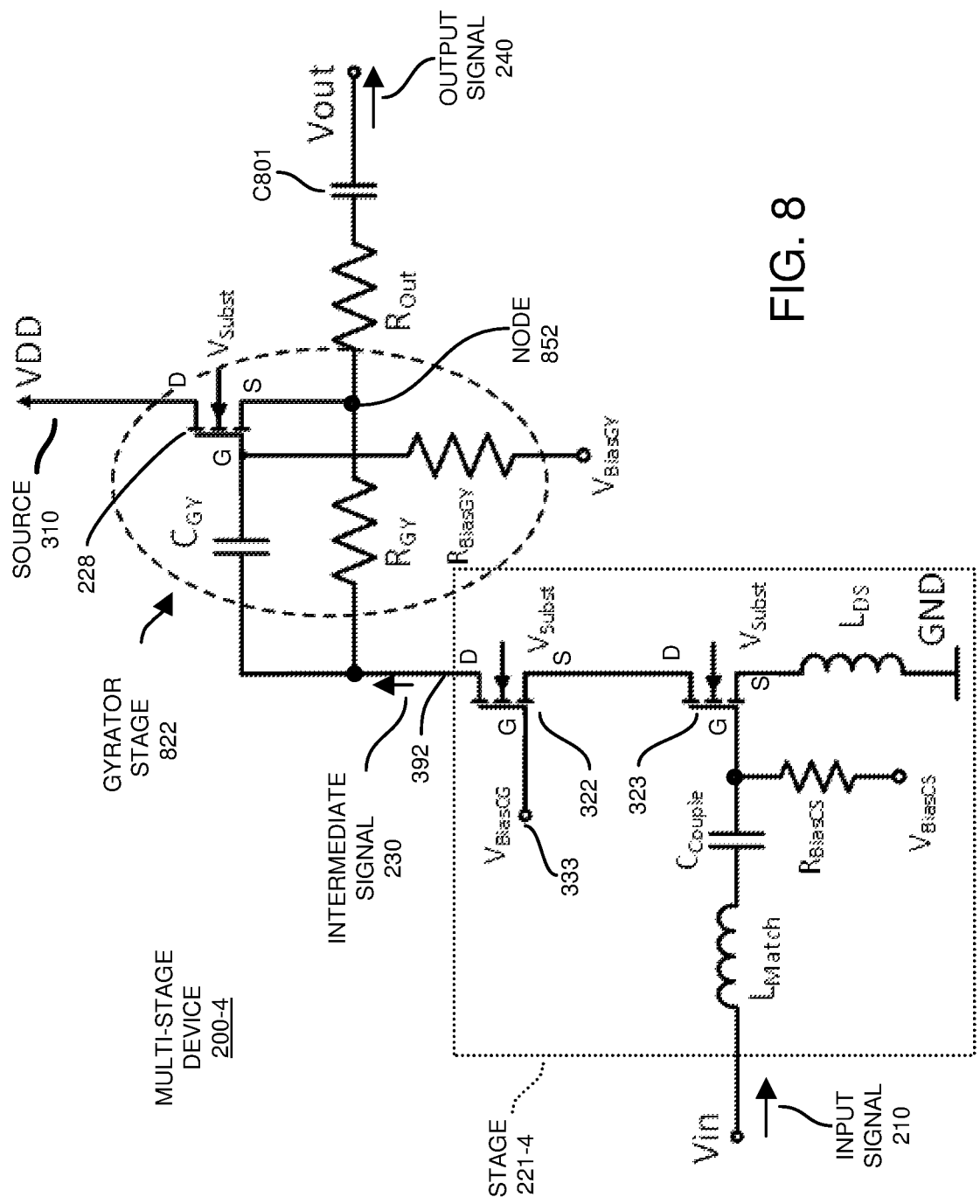
FIG. 8 is an example diagram illustrating a general form of a multi-stage amplifier circuit according to embodiments herein.

FIG. 8 is an example diagram illustrating a general form of a multi-stage amplifier circuit according to embodiments herein.

As shown in this example embodiment, the input stage 221-4 of multi-stage device 200-4 includes transistor 322, transistor 323, inductor Lmatch, capacitor Ccouple, resistor $R_{BIASCS}$, and inductor LDS.

In this example embodiment, as shown in stage 221-4, the input signal 210 is inputted to a circuit path including a series combination of inductor Lmatch and capacitor Ccouple connected to the gate node of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to the node 392; the source node (S) of the transistor 322 is coupled to the drain node (D) of transistor 323; the inductor Lis couples the source node (S) of the transistor 323 to the ground reference (GND).

As further shown, the gyrator stage 822 (or output buffer) of multi-stage device 200-4 includes power source 310 (such as $V_{DD}$), capacitor $C_{GY}$, resistor $R_{OUT}$, transistor 228, resistor $R_{GY}$, capacitor C801, and resistor $R_{BIASGY}$.

Further in this example embodiment, as shown in gyrator stage 822, the source 310 is connected to the drain node (D) of the transistor 228. The resistor $R_{GY}$ couples the node 392 to the source node (S) of the transistor 228. Capacitor $C_{GY}$ couples the node 392 to the gate node (G) of the transistor 228. The resistor $R_{BIASGY}$ receives input voltage $V_{BIASGY}$ and is coupled to the gate node (G) of transistor 228. A series combination of the resistor $R_{OUT}$ and capacitor C801 coupled to node 852 provides a circuit path from which to output the output signal 240 from the multi-stage device 200-4.

In this example embodiment, the stage 822 (output buffer) of the multi-stage device 200-4 is implemented using a so-called Gyrator principle (i.e., active inductor).

More specifically, as previously discussed, the gyrator stage 822 of multi-stage device 200-4 includes capacitor $C_{GY}$, resistor $R_{GY}$, transistor 228, and resistor $R_{BIASGY}$. In such an instance, the multi-stage device 200-4 outputs the output signal 240 from node 852 through resistor ROUT and capacitor C801.

As previously discussed, the output signal 240 from the multi-stage device 200-4 is an amplified rendition of the input signal 210.

In one embodiment, implementing the second stage of the multi-stage device 200-4 as a gyrator stage 822 (as shown in FIG. 8) reduces a footprint of a corresponding semiconductor chip on which the multi-stage device 200 is fabricated. However, the overall performance of the multi-stage device 200-4 may be lower compared to the implementations of the stage 222 using inductor coils as previously discussed.

Figure 9:
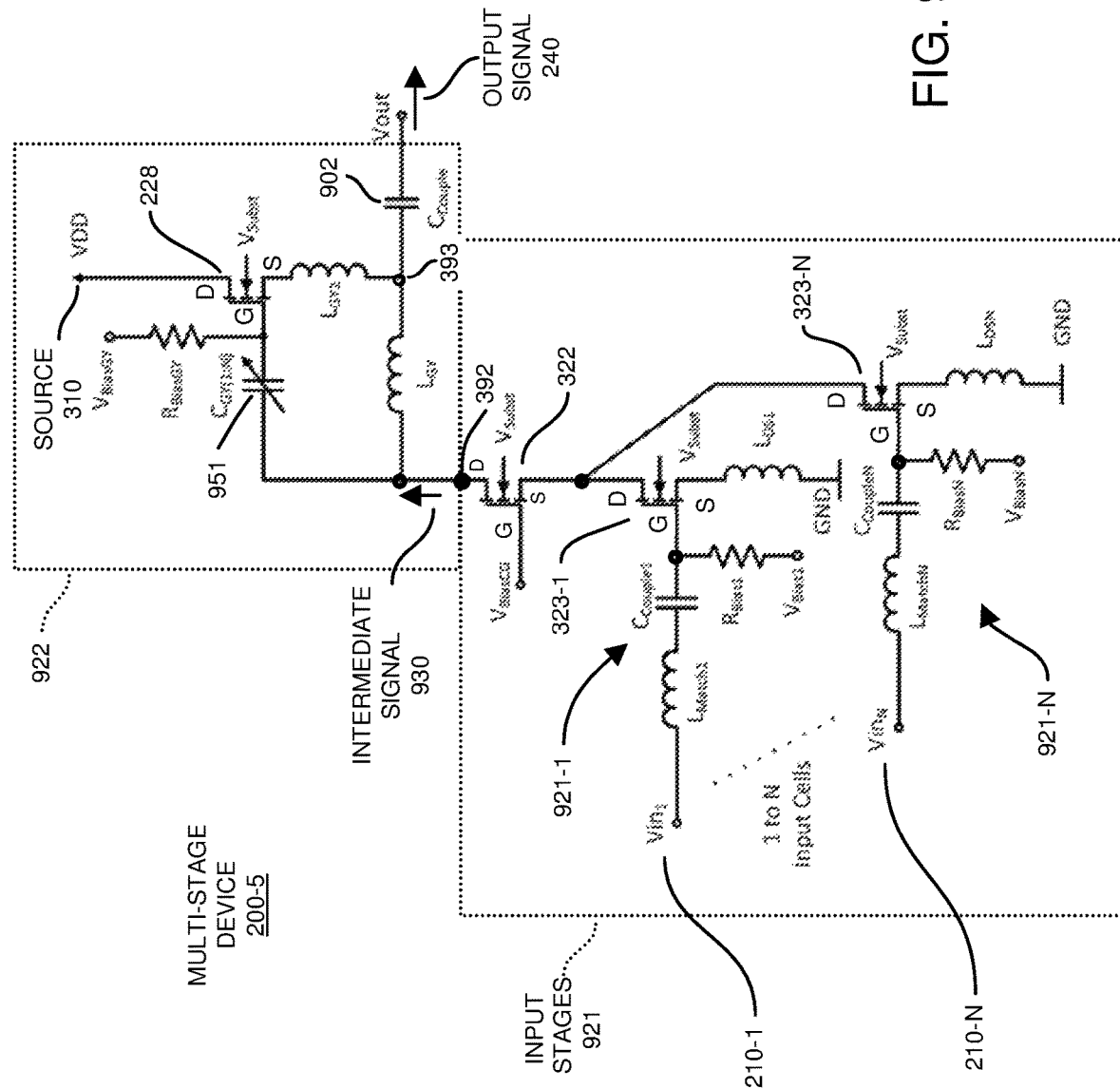
FIG. 9 is an example diagram illustrating implementation a multi-stage amplifier circuit including multiple input stages according to embodiments herein.

FIG. 9 is an example diagram illustrating implementation of a multi-stage amplifier circuit using multiple input stages according to embodiments herein.

As shown in this example embodiment, input stages 921 includes input stage 921-1, . . . , input stage 921-N, where N>1.

Input stage 921-1 of multi-stage device 200-5 includes transistor 322, transistor 323-1, inductor Lmatch1, capacitor Ccouple1, resistor $R_{BIAS1}$, and inductor $L_{DS1}$. Input stage 921-N of multi-stage device 200-5 includes transistor 322, transistor 323-N, inductor LmatchN, capacitor CcoupleN, resistor $R_{BIASN}$, and inductor $L_{DSN}$.

In this example embodiment, as shown in input stage 921-1, the input signal 210-1 is inputted to a circuit path including a series combination of inductor Lmatch1 and capacitor Ccouple1 connected to the gate node of transistor 323-1. Input voltage $V_{BIASCS1}$ is inputted to a circuit path including resistor $R_{BIASCS1}$ coupled to the gate node (G) of the transistor 323-1. A series combination of transistor 322, transistor 323-1, and inductor $L_{DS1}$ connect node 392 to the ground reference (GND). More specifically, the drain node (D) of transistor 322 is coupled to the node 392; the source node (S) of the transistor 322 is coupled to the drain node (D) of transistor 323-1; the inductor $L_{DS1}$ couples the source node (S) of the transistor 323-1 to the ground reference (GND).

As shown in input stage 921-N, the input signal 210-N is inputted to a circuit path including a series combination of inductor LmatchN and capacitor CcoupleN connected to the gate node (G) of transistor 323-N. Input voltage $V_{BIASCSN}$ is inputted to a circuit path including resistor $R_{BIASCSN}$ coupled to the gate node (G) of the transistor 323-N. A series combination of transistor 322, transistor 323-N, and inductor $L_{DSN}$ connect node 392 to the ground reference (GND). More specifically, the drain node (D) of transistor 322 is coupled to the node 392; the source node (S) of the transistor 322 is coupled to the drain node (D) of transistor 323-N; the inductor $L_{DSN}$ couples the source node (S) of the transistor 323-N to the ground reference (GND).

As further shown, the stage 922 (or output buffer) of multi-stage device 200-5 includes power source 310 (such as $V_{DD}$), capacitor $C_{GY(1:N)}$, transistor 228, resistor $R_{BIASGY}$, inductor $L_{GY2}$, inductor $L_{GY1}$, and capacitor 902 (Couple).

More specifically, in stage 922, the capacitor 951 ($C_{GY(1:N)}$) provides connectivity between node 392 and the gate node (G) of the transistor 228. The resistor $R_{BIASGY}$ receives input voltage $V_{BIASGY}$ and is coupled to the gate node of transistor 228. The power source 310 (VDD) is connected directly to the drain node (D) of the transistor 228; inductor LGY2 couples a source node (S) of the transistor 228 to node 393; inductor LGY couples node 392 to node 393; capacitor 902 couples node 393 to the output of the multi-stage device 200-2 producing the output signal 240.

In this embodiment, input stage 921 includes multiple parallel cascodes to produce intermediate signal 930. In one embodiment, each of the respective inductors are disposed on a semiconductor chip. As shown, the stage 922 includes switchable capacitor $C_{GY}$.

The impedance of the input stage 921 and output stage 922 are selected such that the multi-stage device 900 operates in a broadband range of frequencies.

Figure 10:
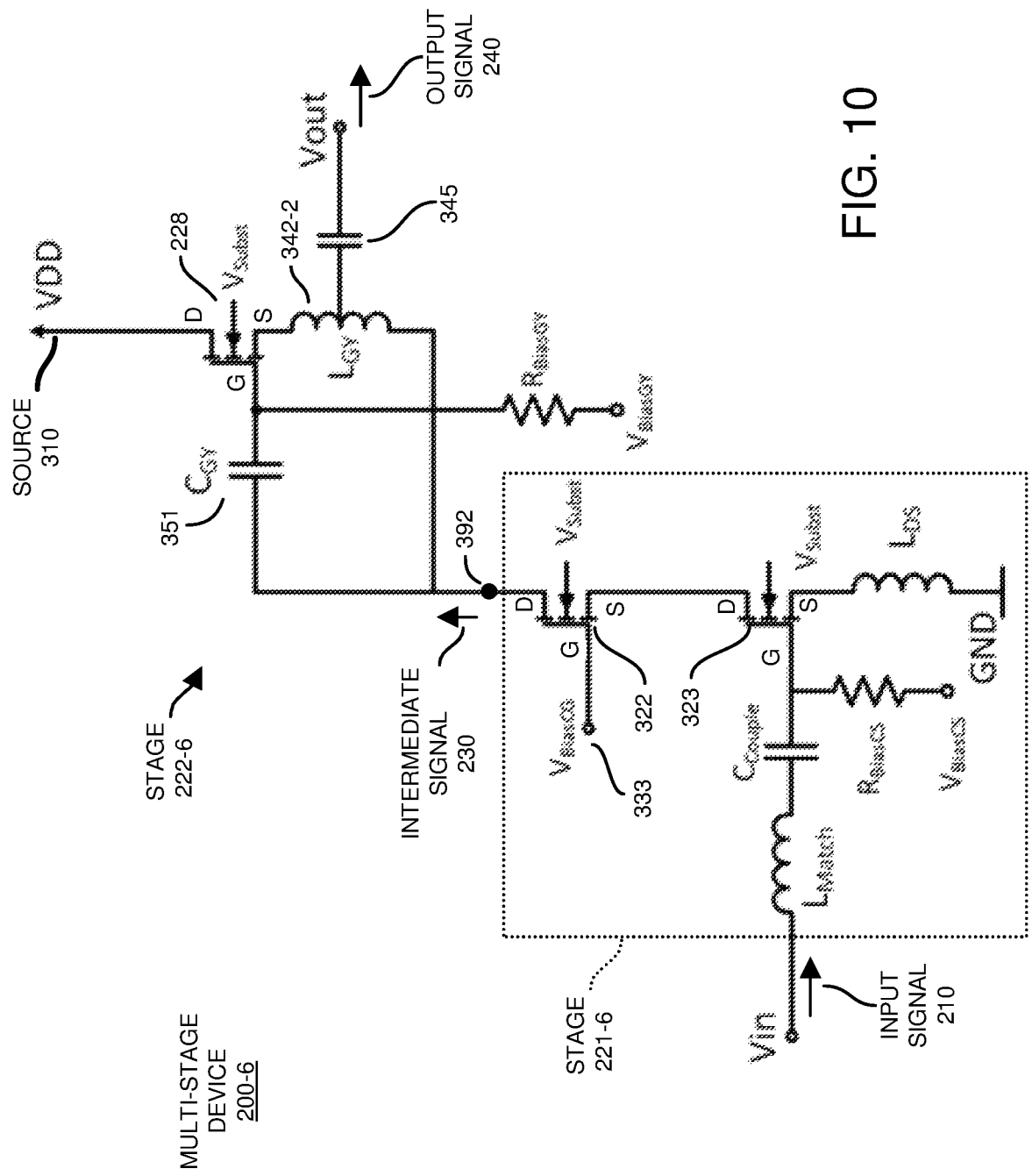
FIG. 10 is an example diagram illustrating implementation of a multi-stage amplifier circuit according to embodiments herein.

FIG. 10 is an example diagram illustrating implementation of a multi-stage amplifier circuit according to embodiments herein.

As shown in this example embodiment, the input stage 221-6 of multi-stage device 200-6 includes transistor 322, transistor 323, inductor Lmatch, capacitor Ccouple, resistor $R_{BIASCS}$, and inductor $L_{DS}$.

In this example embodiment, as shown in stage 221-6, the input signal 210 is inputted to a circuit path including a series combination of inductor Lmatch and capacitor Ccouple connected to the gate node (G) of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to the node 392; the source node (S) of the transistor 322 is coupled to the drain node (D) of transistor 323; the inductor Lis couples the source node (S) of the transistor 323 to the ground reference (GND).

As further shown, the output stage 222-6 (or output buffer) of multi-stage device 200-6 includes capacitor 351, power supply $V_{DD}$, component 342-2 (such as a tapped inductor $L_{GY}$), transistor 228, resistor RbiasGY, and capacitor 345.

Further in this example embodiment, as shown in stage 222-6, the capacitor 351 provides connectivity between node 392 and the gate node (G) of the transistor 228. The resistor $R_{BIASGY}$ receives input voltage $V_{BIASGY}$ and is coupled to the gate node (G) of transistor 228. The power source 310 ($V_{DD}$) is connected directly to the drain node (D) of the transistor 228; component 342-2 (such as tapped inductor $L_{GY}$) couples a source node (S) of the transistor 228 to node 393; component 345 (such as a capacitor) couples the tapped node 1093 of inductor $L_{GY}$ to the output of the multi-stage device 200-6 producing the output signal 240.

The multi-stage device 200-6 in FIG. 10 operates in similar manner as previously discussed. For example, stage 221-6 operates in a similar manner as previously discussed. However, the inductors L1 and L2 in FIG. 5 are replaced with a tapped inductor $L_{GY}$ as shown in stage 222-6 of the multi-stage device 200-6 in FIG. 10.

Figure 11:
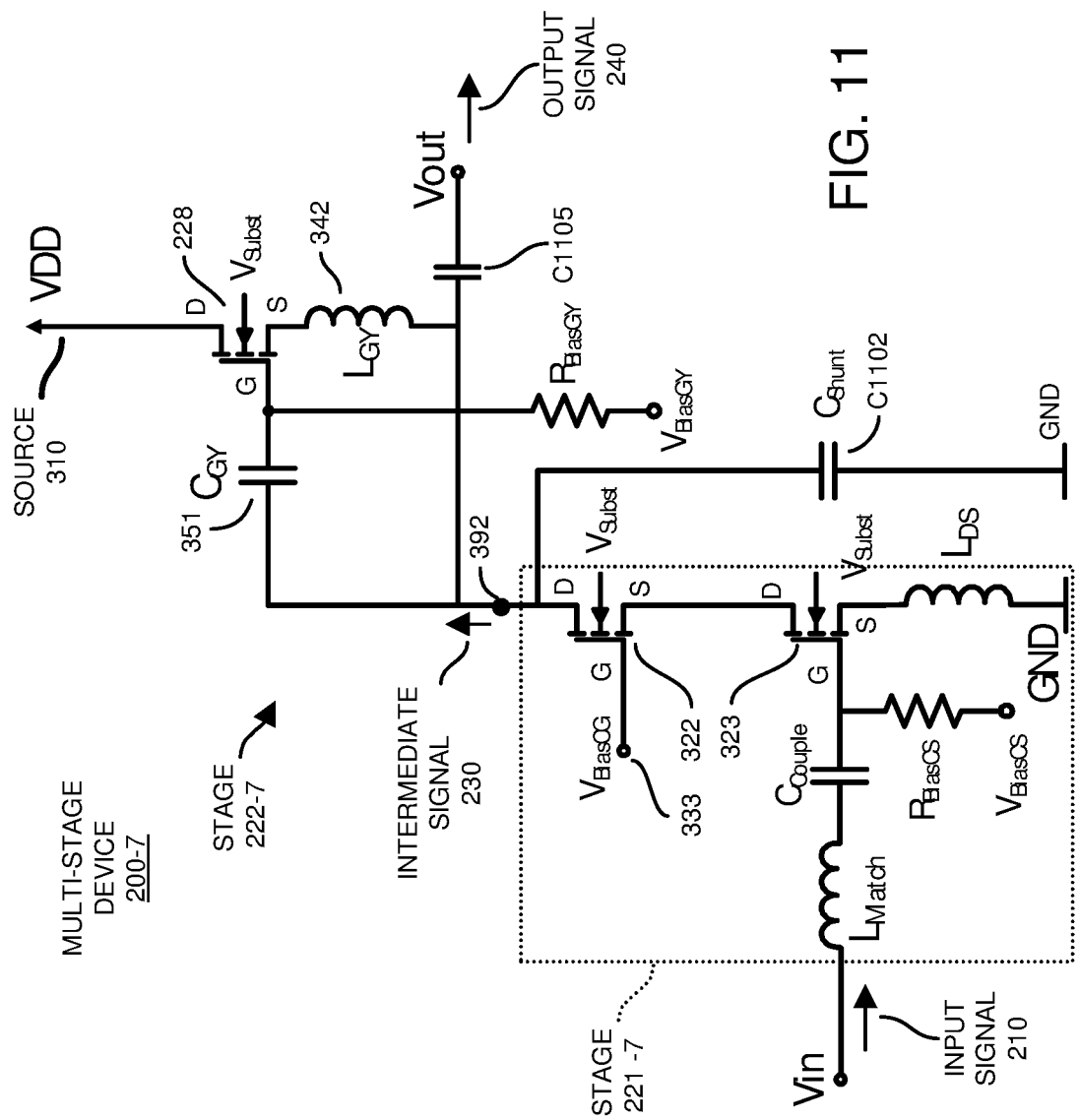
FIG. 11 is an example diagram illustrating implementation of a multi-stage amplifier circuit according to embodiments herein.

FIG. 11 is an example diagram illustrating implementation of a multi-stage amplifier circuit according to embodiments herein.

As shown in this example embodiment, the input stage 221-7 of multi-stage device 200-7 includes transistor 322, transistor 323, inductor Lmatch, capacitor Ccouple, resistor $R_{BIASCS}$, and inductor $L_{DS}$. In this example embodiment, as shown in stage 221-7, the input signal 210 is inputted to a circuit path including a series combination of inductor Lmatch and capacitor Ccouple connected to the gate node (G) of transistor 323. Input voltage $V_{BIASCS}$ is inputted to a circuit path including resistor $R_{BIASCS}$ coupled to the gate node (G) of the transistor 323. A series combination of transistor 322, transistor 323, and inductor $L_{DS}$ connect node 392 of the stage 221-1 to the ground reference (GND). More specifically, the drain node (D) of transistor 322 is coupled to node 392; the source node (S) of the transistor 322 is coupled to the drain node (D) of transistor 323; the inductor $L_{DS}$ couples the source node (S) of the transistor 323 to the ground reference (GND).

As further shown, the output stage 222-7 (or output buffer) of multi-stage device 200-7 includes capacitor 351, power source 310 (such as voltage $V_{DD}$), component 342 (such as an inductor $L_{GY}$), transistor 228, resistor RbiasGY, and capacitor 1105.

Further in this example embodiment, as shown in stage 222-7, the capacitor 351 provides connectivity between node 392 and the gate node (G) of the transistor 228. The resistor $R_{BIASGY}$ receives input voltage $V_{BIASGY}$ and is coupled to the gate node (G) of transistor 228. The power source 310 ($V_{DD}$) is connected directly to the drain node (D) of the transistor 228; component 342 (such as inductor $L_{GY}$) couples a source node (S) of the transistor 228 to node 392; component C1105 (such as a capacitor) couples the node 392 to the output of the multi-stage device 200-7 producing the output signal 240.

In this example embodiment, the component 341 (as previously discussed with respect to FIG. 3) is a short circuit; the component 342 (as previously discussed in FIG. 3) is inductor $L_{GY}$; the component 343 (as previously discussed in FIG. 3) is a short circuit or low impedance connection to node 392; the component 344 (as previously discussed in FIG. 3) is a short circuit such that node 392 is coupled to the output of the stage 222 via capacitor C1105. Additional capacitor C1102 shunts the node 392 to ground.

In a similar manner as previously discussed, application of $V_{BIASGY}$ through resistor $R_{BIASGY}$ to the gate (G) node of the transistor 228 in stage 222-7 biases the gate node (G) to produce the output signal 240 from the intermediate signal 230 outputted from the stage 221-7.

Figure 12:
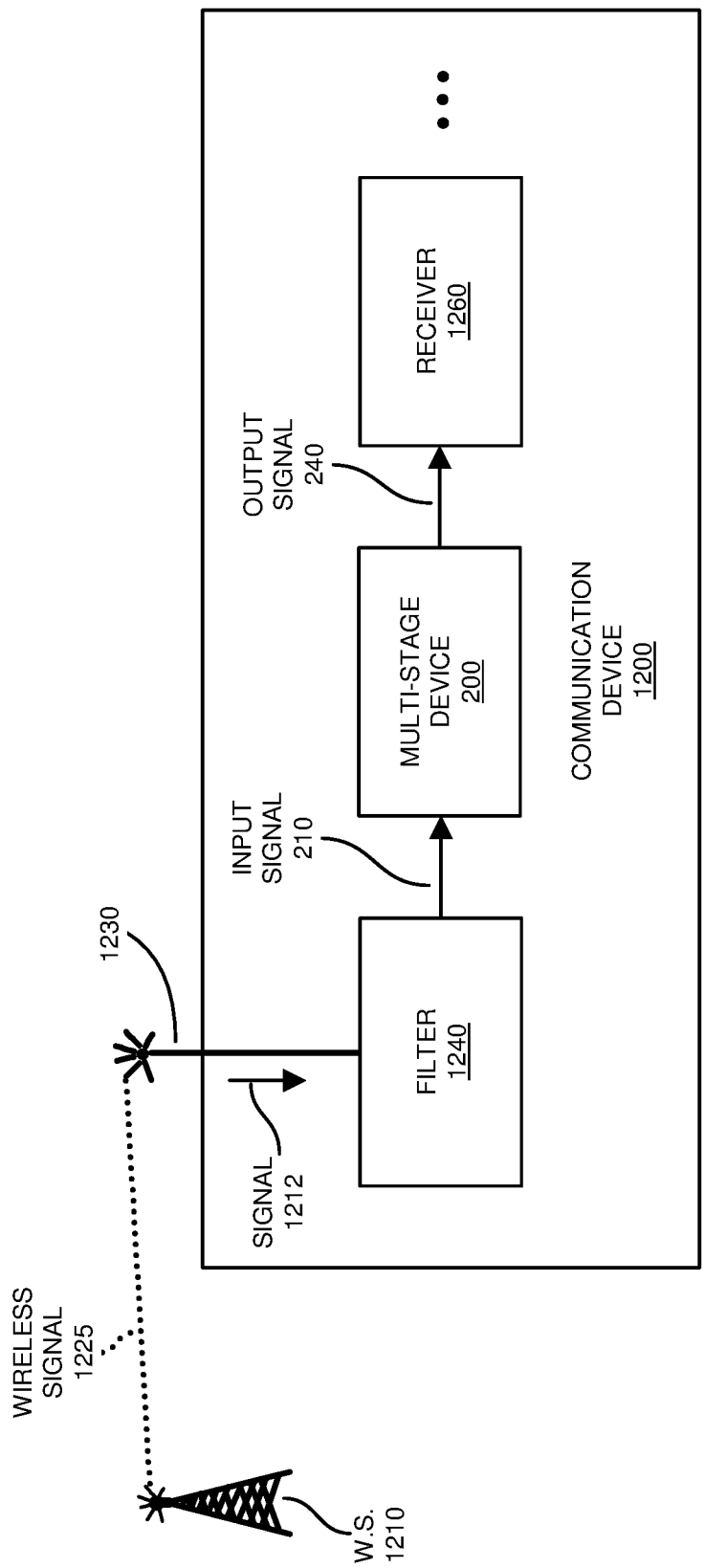
FIG. 12 is an example diagram illustrating implementation of multi-stage circuitry in a wireless device application according to embodiments herein.

FIG. 12 is an example diagram illustrating implementation of multi-stage circuitry in a wireless device according to embodiments herein.

As previously discussed, in one embodiment, multi-stage device 200 is an amplifier circuit used in any suitable application.

In this example embodiment, the multi-stage device 200 is implemented in a communication device 1200. As shown, the communication device 1200 includes an antenna 1230 to receive a wireless signal 1225 transmitted from the wireless station 1210. Wireless signal 1225 conveys any suitable data such as voice, video, text, etc.

The antenna 1230 converts the wireless signal 1225 into RF signal 1212, which is inputted to the filter 1240. As its name suggests, the filter 1240 filters the received RF signal 1212 such that the input signal 210 includes one or more frequencies or one or more ranges of frequencies of interest from the signal 1212.

In a similar manner as previously discussed, the multi-stage device 200 converts (amplifies such as via low noise amplification) the received input signal 210 into the output signal 240.

Receiver 1260 of the communication device 1200 receives the output signal 240 and performs further operations such as demodulating, decoding, etc., perform functions such as display video, display text, store data, generate an audio signal, etc.

Accordingly, multi-stage device is useful to support amplification of low amplitude signals into higher amplitude signals.

Functionality supported by the different resources will now be discussed via flowchart in FIG. 14. Note that the steps in the flowcharts below can be executed in any suitable order.

Figure 13:
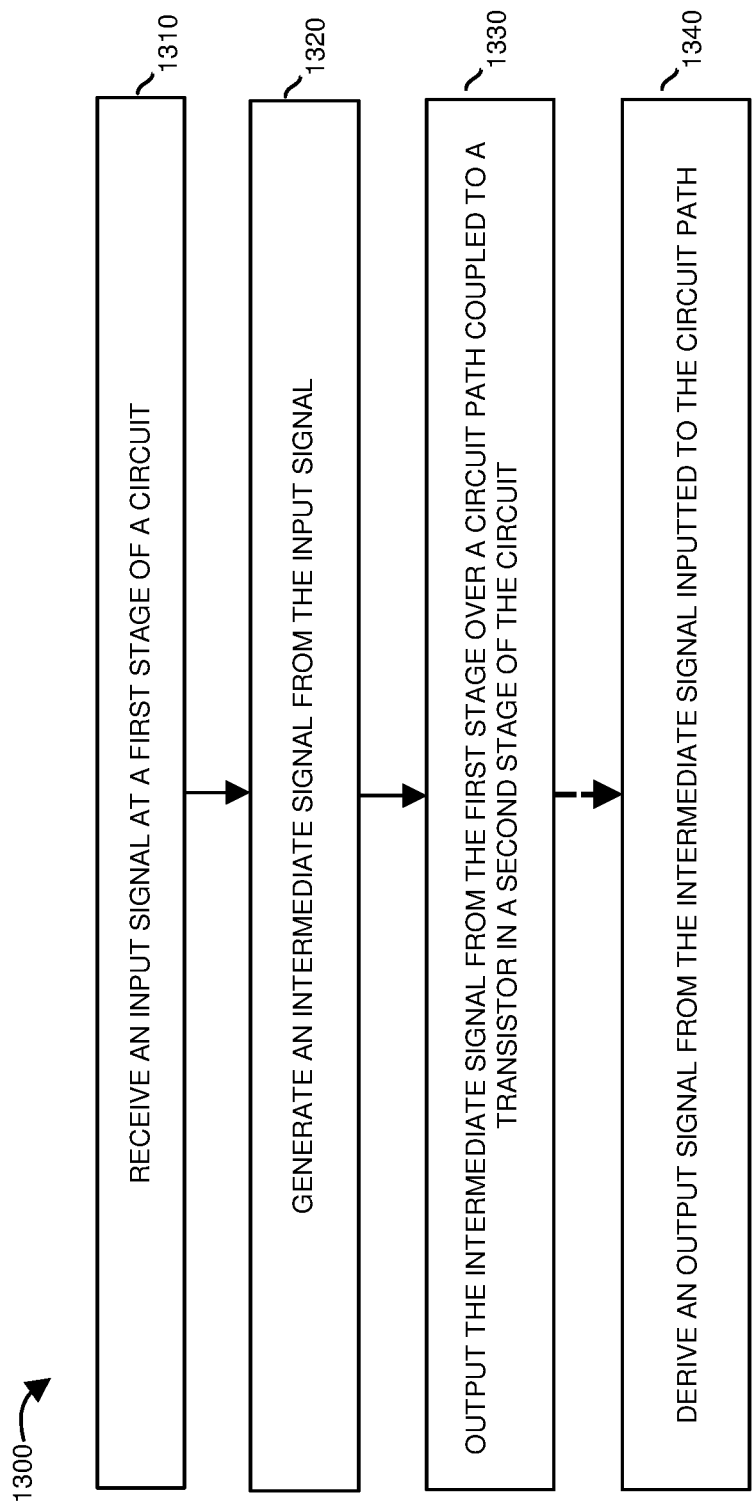
FIG. 13 is an example diagram illustrating a method providing signal amplification according to embodiments herein.

FIG. 13 is a flowchart 1300 illustrating an example method according to embodiments herein. Note that there will be some overlap with respect to concepts as discussed above.

In processing operation 1310, the multi-stage device 200 receives an input signal 210.

In processing operation 1320, the multi-stage device generates an intermediate signal 230 from the input signal 210.

In processing operation 1330, the first stage 221 inputs the intermediate signal 230 to a circuit path 225 coupled to a transistor 228 in the second stage 222 of the multi-stage device 200.

In processing operation 1340, the inputted intermediate signal 230 controls operation of the transistor 228 in the second stage 222 to derive an output signal 240.

Note again that techniques herein are well suited for use in multi-stage devices s amplifier circuits. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels.

Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An amplifier comprising:
   a first amplifier stage to receive an input signal, the first amplifier stage producing an intermediate signal based on the input signal; and
   a second amplifier stage coupled to the first amplifier stage to receive the intermediate signal and produce an output signal, the second amplifier stage including:
   i) a transistor,
   ii) a power source coupled to supply voltage to a first node of the transistor, and
   iii) a circuit path between the first amplifier stage and the transistor, the intermediate signal inputted to the circuit path to control the transistor and produce the output signal from a second node of the transistor based on the intermediate signal.

2. The amplifier as in claim 1, wherein the output signal is an amplified rendition of the input signal.

3. The amplifier as in claim 1, wherein an impedance of the second amplifier stage is matched to an impedance of the first amplifier stage.

4. The amplifier as in claim 1 further comprising:
   a capacitor, the capacitor coupling an output node of the first amplifier stage outputting the intermediate signal to a third node of the transistor, the third node being a gate node.

5. The amplifier as in claim 1, wherein the transistor is a first transistor, the apparatus further comprising:
   a second transistor operable to control an amount of current associated with the intermediate signal outputted to the second amplifier stage.

6. An amplifier comprising:
   a first stage to receive an input signal, the first stage producing an intermediate signal based on the input signal; and
   a second stage coupled to the first stage to receive the intermediate signal and produce an output signal, the second stage including:
   i) a transistor, and
   ii) a circuit path between the first stage and the transistor, the intermediate signal inputted to the circuit path to derive the output signal from the intermediate signal, the amplifier further comprising:
   a first component and a second component disposed in series between a node of the first stage outputting the intermediate signal and a node of the transistor, the output signal derived from a circuit node coupling the first component to the second component.

7. The amplifier as in claim 6, wherein the node of the transistor is a source node of the transistor.

8. The amplifier as in claim 7, wherein the circuit path is a first circuit path, the apparatus further comprising:
a second circuit path between the node of the first stage producing the intermediate signal and a gate node of the transistor.

9. The amplifier as in claim 8, wherein the second circuit path includes a capacitor coupling the node of the first stage outputting the intermediate signal to the gate node of the transistor.

10. The amplifier as in claim 1, wherein the second amplifier stage is operable to reuse current supplied via the intermediate signal outputted from the first amplifier stage to generate the output signal.

11. The amplifier as in claim 1, wherein a combination of the first amplifier stage and the second amplifier stage is an amplifier circuit, the apparatus further comprising:
an antenna to receive a wireless signal, the antenna converting the wireless signal into the input signal inputted to the first amplifier stage, the amplifier circuit operable to amplify the input signal into the output signal.

12. The amplifier as in claim 1, wherein the intermediate signal produced by the first amplifier stage controls operation of the transistor and corresponding flow of current through the circuit path to produce the output signal.

13. The amplifier as in claim 1, wherein an impedance of the second amplifier stage is substantially matched to an impedance of the first amplifier stage over a 1.5 GHz frequency range.

14. The amplifier as in claim 1, wherein a combination of the second amplifier stage is a common drain amplifier circuit to amplify the input signal into the output signal.

15. A method comprising:
receiving an input signal at a first stage of a circuit;
generating an intermediate signal from the input signal;
inputting the intermediate signal to a circuit path coupled to a transistor in a second stage of the circuit, a power source coupled to supply voltage to a first node of the transistor, the intermediate signal controlling operation of the transistor; and
producing an output signal from a second node of the transistor via control of the transistor based on the intermediate signal inputted to the circuit path.

16. The method as in claim 15, wherein producing the output signal includes:
utilizing the intermediate signal as input to the circuit path to control a third node of the transistor and corresponding flow of current through the transistor to produce the output signal, the third node being an input node of the transistor.

17. The method as in claim 15, wherein inputting the intermediate signal includes: inputting the intermediate signal to a first component of the second stage, the first component and a second component of the second stage disposed in series between a node of the first stage producing the intermediate signal and the second node of the transistor.

18. The method as in claim 17 further comprising:
outputting the output signal from a third component coupled to a circuit node coupling the first component to the second component.

19. The method as in claim 15, wherein the circuit path is a first circuit path to a gate node of the transistor, the method further comprising:
inputting the intermediate signal generated by the first stage over a second circuit path to a drain node of the transistor.

20. The method as in claim 15 further comprising:
utilizing current associated with the intermediate signal outputted from the first stage into the circuit path to generate the output signal.

21. The method as in claim 15 further comprising:
receiving a wireless signal at an antenna; and
producing the input signal based on the received wireless signal; and
amplifying the input signal to produce the output signal.

22. The method as in claim 15 further comprising:
producing the output signal to be an amplified rendition of the input signal.

23. The method as in claim 15 further comprising:
inputting the intermediate signal to control operation of the transistor and corresponding flow of current through the circuit path to produce the output signal.

24. The amplifier as in claim 1, wherein the intermediate signal is an amplified rendition of the input signal.

25. The amplifier as in claim 1 further comprising:
a first component disposed in the circuit path between an output node of the first amplifier stage outputting the intermediate signal and a third node of the transistor.

26. The amplifier as in claim 25 further comprising:
a second component disposed between the node of the first amplifier stage outputting the intermediate signal and the second node of the transistor.

27. The amplifier as in claim 1, wherein the first node of the transistor is a drain node; and
wherein the second node of the transistor is a source node.

28. The amplifier as in claim 1 further comprising:
a bias voltage source operable to generate a bias voltage, the bias voltage inputted to the circuit path.

29. The amplifier as in claim 1 further comprising:
a first component disposed between an output node of the first amplifier stage outputting the intermediate signal and a third node of the transistor.

30. The amplifier as in claim 1 further comprising:
a first component and a second component disposed in series between a node of the first amplifier stage outputting the intermediate signal and the second node of the transistor, a setting of the first component controlling a gain provided by the second amplifier stage.

31. The amplifier as in claim 30, wherein a setting of the second component is selected to match an impedance of the second amplifier stage to an impedance of the first amplifier stage.

32. The amplifier as in claim 30, wherein a setting of the second component controls an output impedance associated with the output signal.

33. The amplifier as in claim 1 further comprising:
a first component disposed between a node of the first amplifier stage outputting the intermediate signal and a third node of the transistor, the third node being an input node, the intermediate signal conveyed through the first component to the third node of the transistor and controlling activation of the transistor; and
a second component disposed between the node of the first amplifier stage outputting the intermediate signal and the second node of the transistor, the second component controlling a gain of the output signal with respect to the intermediate signal.

34. The amplifier as in claim 33, wherein the output signal is an amplified rendition of the intermediate signal.

\* \* \* \* \*